United States Patent [19]
Levy

[11] Patent Number: 5,414,744
[45] Date of Patent: May 9, 1995

[54] SERIAL BIT INPUT CONTROLLER

[75] Inventor: Paul S. Levy, Chandler, Ariz.

[73] Assignee: VLSI Technology, Inc., San Jose, Calif.

[21] Appl. No.: 126,289

[22] Filed: Sep. 24, 1993

[51] Int. Cl.$^6$ .................. G11C 19/00; H03K 19/0175
[52] U.S. Cl. ........................ 377/75; 377/70; 340/825.65; 326/62
[58] Field of Search ............ 377/70, 75, 76, 77, 377/114; 341/64; 375/21; 340/825.65; 307/475

[56] References Cited

U.S. PATENT DOCUMENTS

| | | | |
|---|---|---|---|
| 4,186,345 | 1/1980 | Marita et al. | 340/825.65 |
| 4,850,000 | 7/1989 | Dias | 377/75 |
| 5,325,398 | 6/1994 | Murakami et al. | 341/64 |

Primary Examiner—Edward P. Westin
Assistant Examiner—Jon Santamauro
Attorney, Agent, or Firm—LaValle D. Ptak

[57] ABSTRACT

A serial bit input controller uses clock and data input lines for communicating command information, as well as the clock and data information, to an integrated circuit chip. The circuit functions by employing a multi-stage shift register as a command storage register. The outputs of the shift register are connected to the inputs of coincidence logic gates, the outputs of which in turn supply signals to command state latch circuits. The selection of any one of the command state latch circuits depends upon the data stored in the multi-stage shift register. The shift register, in turn, is enabled by signals on the clock line by holding the clock line high and toggling it with data pulses. When the desired count is reached, the clock signal is allowed to resume, and is applied to the latch circuits to store the command state in the selected latch circuit. To clear the system, a two-stage binary clear latch is employed. This clear latch is enabled by signals on the clock data line when the clock signals is held low. This circuit is toggled by the next data pulse, which causes it to produce a clear output pulse to all of the command state latch circuits.

7 Claims, 2 Drawing Sheets

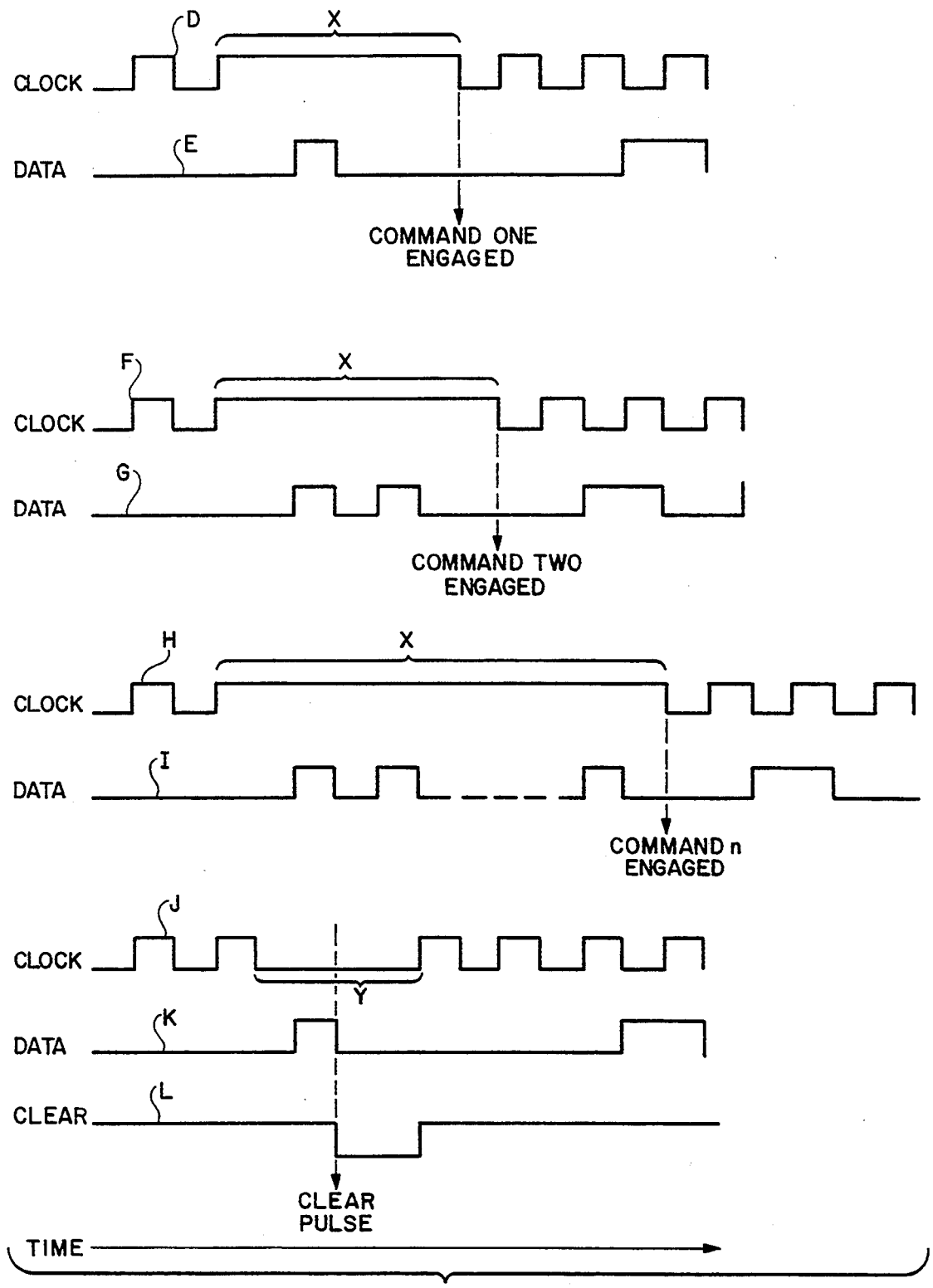

SERIAL BIT INPUT CONTROLLER

BACKGROUND

It frequently is necessary to transfer information from one integrated circuit (IC) package to another. To do this, output signals on different pins of one of the integrated circuit packages must be connected to inputs through leads or pins on the other of the integrated circuit packages. When various clock signals, data signals and command signals need to be communicated from one integrated circuit to another, limitations on the number of dedicated pins or leads on each of the integrated circuit packages frequently are reached. One solution is to increase the size of the package and the number of pin interconnections from the package to the integrated circuit located therein. Since integrated circuit packages, however, typically are sold in configurations having pre-established numbers of pins on them, any requirement which uses large numbers of these pins for transferring information from one package to another necessarily limits the number of input and output connections which can be made to others of the pins. When the package size must be increased to handle larger numbers of pins, costs for both the integrated circuit package and systems with which the package is used are increased.

Efforts have been made in the past to utilize what is known as "packetized" data streams to cause a transmitting IC and a receiving IC to be synchronized with one another. When this is done, the data stream packets then may be assigned specific functions within every given time frame cycle. For example, one part of the data stream may be reserved for address information, whereas another part is reserved for data information. All of the signals, however, travel on the same lead for such a packetized data stream. For such systems to operate, it is necessary to provide accurate synchronization between the operations of the transmitting IC and the receiving IC, since the arrival of information within any given packet or time frame position is what establishes whether the information is of a particular type, such as the address and data information discussed above.

Many applications exist for communication protocols between integrated circuit packages or devices for communicating different command signals or states, prior to the transmission of data related to the particular command states. For example, applications exist in electronic ovens having different command states for "on", "off", "load" (with a specific temperature), and for "start" and "stop" times, with transmission of the necessary time information. If separate leads or pins are required for interconnecting transmitting ICs and receiving ICs for all of these functions, the number of pins required, simply to accommodate the command functions, easily can become excessive.

Accordingly, it is desirable to provide a communication protocol for integrated circuits (ICs) which uses a reduced number of pins to control the different command states without using packetized data streams.

SUMMARY OF THE INVENTION

It is an object of this invention to provide an improved communication protocol for integrated circuits.

It is another object of this invention to provide an improved communication protocol for integrated circuits using a reduced number of pins.

It is a further object of this invention to provide an improved communication protocol for integrated circuits requiring only two inputs to access an integrated circuit chip for all clock, data and control signals.

In a preferred embodiment of the invention, a serial bit input controller operates with two inputs, clock and data. Circuitry is provided to select any one of N command modes by holding the clock input in one of its two binary states, and toggling the data input to cause a command storage register to provide an output indicative of the particular command state being selected. When the clock is released, a change in state on the clock input, from a first binary state to a second binary state, operates through a gating and latch circuit to store the selected command state. Whenever the command modes are to be cleared, the clock input is held in a second binary state, and toggling on the data input line functions to clear the command state latches.

BRIEF DESCRIPTION OF THE DRAWING

FIG. 2 illustrates various waveforms useful in describing the operation of the circuit of FIG. 1.

DETAILED DESCRIPTION

Figure 1:
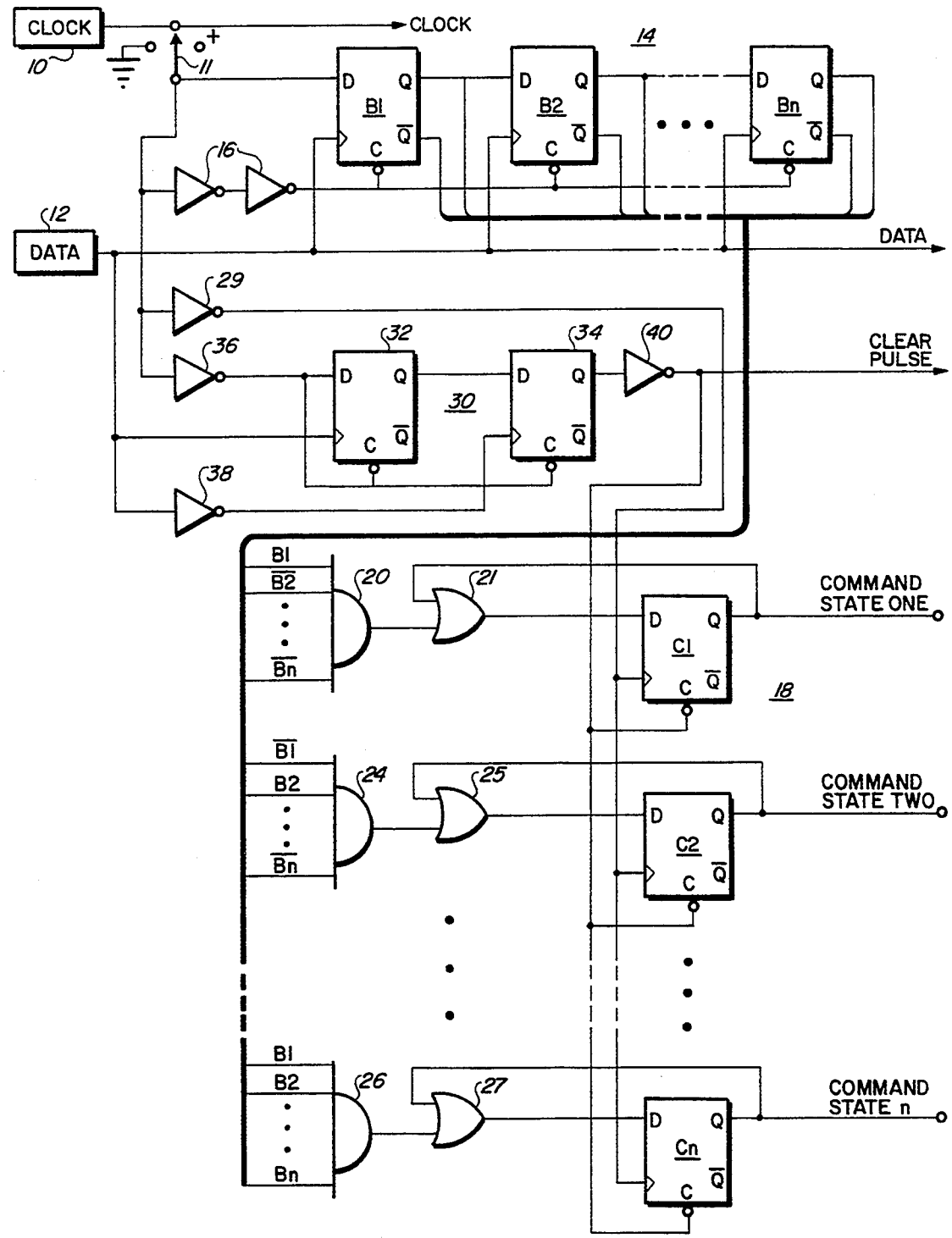
FIG. 1 is schematic diagram of a preferred embodiment of the invention.

Reference now should be made to the drawings, in which FIG. 1 is a block circuit diagram of a preferred embodiment of the invention. The invention disclosed in FIG. 1 allows signals on only two inputs, namely clock signals from a clock source 10 and data signals from a data source 12, also to be used for additional purposes by an integrated circuit chip, of which the circuit of FIG. 1 is a part. In the circuit of FIG. 1, these additional purposes comprise providing any desired one or more of several different command states for utilization by other circuit elements (not shown) of the integrated circuit chip.

The clock and data inputs 10 and 12, respectively, shown on FIG. 1, are applied to input pins coupled to bonding pads for supplying information on these inputs to the circuit of FIG. 1. Different combinations of clock and data pulses are shown in FIG. 2; and these pulses or signals are typical binary signals having "high" and "low" or "one" and "zero" states. Typically, the clock signals are at some pre-established frequency provided by a clock signal generator (not shown) in a system of which the portion of the chip shown in FIG. 1 is a part. These signals typically are square-wave alternating signals of the pre-established clock frequency. Data signals on the input 12 typically comprise various combinations of binary signals for utilization by the circuit associated with the circuit portion shown in FIG. 1.

To enable use of the clock and data inputs for establishing or selecting various command states without operating the data stream as a "packetized" data stream, the circuit shown in FIG. 1 employs a command storage register 14 in the form of a multi-stage digital shift register, three stages of which, B1, B2 and Bn, are shown. The enable input "D" for the first stage B1 is connected through a three-position selection switch 11 to the clock signal input 10 in the position shown in FIG. 1. The switch 11, however, can be moved to either a left position or a right position from the central position shown. The left position of the switch 11 causes the clock signal to be connected to ground (held low). The right position of the switch 11 connects to a source of positive operating potential (+), so that the clock signal line 10 essentially is held "high", irrespective of the nature of the clock signals coming from the source 10.

The enable inputs for each of the other stages of the register 14 are from the normal or "Q" outputs to the enable input (D) of the next succeeding stage in a conventional interconnection. The bistable circuits B1 through Bn of the circuit 14 are interconnected as a standard multi-stage shift register. The toggle signals for the stages B1 through Bn of the shift register 14 are obtained directly from the data input terminal 10.

The two outputs from each of the stages of the register/counter 14, illustrated as "Q" and "Q", are supplied in the corresponding different combinations for the total number of different states which can be obtained by the shift register 14 to a corresponding number of AND gates, three of which are illustrated as gates 20, 24 and 26 in FIG. 1. As illustrated, the inputs to the AND gate 20 are the normal output from stage B1 and all of the inverted inputs from the remainder of the stages of the shift register 14, while the inputs to the AND gate 26 are all of the normal or uninverted outputs from the shift register 14. As illustrated in FIG. 1, the inputs to the AND gate 24 are shown with the normal or non-inverted inputs from the output of the stage B2 of the shift register 14, while the other inputs are the inverted inputs.

The number of gates, such as the gates 20, 24 and 26, is selected to correspond with each of the different signal combinations which may be obtained from the shift register 14; so that each of the AND gates produces an output uniquely corresponding to a particular command mode or command signal.

The outputs of the gates 20 through 24 are connected, respectively, to one of two inputs of a corresponding set of OR gates 21, 25 and 27. Each of the OR gates, in turn, has its output connected, respectively, to the enable input of a corresponding bistable latch C1, C2 and Cn of a command state circuit 18.

The toggle inputs of the different bistable latches C1, C2, through Cn all are connected to the output of an inverter amplifier 29, which receives its signals from the switch 11. Consequently, whenever a clock signal from the source 10 is applied through the switch 11, the falling edge is amplified and inverted to produce a toggle pulse to all of the latch circuits in the command state circuit 18. If any of the latches C1, C2 through Cn has a positive enable signal applied to its "D" input at the time a toggle pulse arrives, the latch is set, as is well known, to produce a "high" output on its normal or "Q" output terminal. It should be noted that normal data information is latched on the rising edge of the clock signals in the "data transmission" part of the protocol with which this system is used.

The output terminals for the three command latch stages C1, C2 and Cn shown in FIG. 1 are identified for different command states, such as command state 1, command state 2, and command state n. These different command states then are utilized by the remainder of the integrated circuit (not shown) for operating the functions which the command state signals are designated to perform. It should be noted that once a command state latch, such as the latch C1, is set to produce a "high" output, that output also is connected to the second input of the corresponding OR gate such as 21, which is coupled to the enable input of the same latch.

As a consequence, even if the data in the shift register 14 subsequently changes, once a latch such as C1 through Cn is set, it remains set until the latch is cleared.

Pulses for clearing the command state latches C1, C2 through Cn, and for operation as a clear pulse in other parts of the integrated circuit associated with the portion shown in FIG. 1, are obtained from a two-stage binary clear circuit 30. The circuit 30 includes two cascaded binary stages 32 and 34. Enabling signals for the input stage 32 are obtained from the output of an inverting amplifier 36, the input of which receives signals from the switch 11. Toggle pulses for the stages 32 and 36 are obtained from the data signal input 12. These toggle pulses are applied directly to the toggle input of the first stage 32, and are inverted by an inverter 38 and applied to the second stage 34. Whenever the output "Q" of the second stage 34 changes from "low" to "high", a pulse transition is supplied through an inverting amplifier 40, which then applies an inverted negative-going "clear" pulse to a "clear" input of each of the stages C1, C2 through Cn of the command state latch circuit 18 to clear all of the command signals and reset all of the latches C1, C2 to Cn to their initial "low" or "zero" state.

When the switch 11 connected in its center position to pass the clock signals from the source 10 to the various circuit elements, no count is stored in the register 14, since the register or counter 14 continuously is reset by the clock pulses applied through the double inverting amplifier 16, the output of which is connected to the clear or reset terminals of each of the stages of the counter 14. The reset state or output of the counter 14 is not used for any command state signals; so that none of the command state latches of the latch circuit 18 are set to produce a command state output. Consequently, the circuit of FIG. 1 essentially is transparent to normal operation of the clock and data signals from the sources of signals 10 and 12.

To select a command mode, the switch 11 is moved to the right-hand position to connect it to a source-of positive potential. This holds the clock signal input high for the circuit shown in FIG. 1. When this is done, the shift register 14 is continuously enabled and shifts through the high state from clock each time a data pulse arrives on the data input 12. There is no need to synchronize the operation; but to select a different command states, a simple count of the data pulses is effected by the shift register 14. When the count in the shift register 14 corresponds to the desired command state to be selected, the switch 11 is moved from the right-hand position back to the position shown in FIG. 1 to permit subsequent clock pulses from the source 10 to be applied to the different parts of the circuit already described.

The first negative-going transition of a clock pulse after release of the "hold high", effected by the switch 11, causes the corresponding command state latch to be engaged. This is illustrated in the top three sets of waveforms of FIG. 2, for selection of different command states. In the upper set of waveforms of FIG. 2, the clock pulses are shown as waveform D, and the data pulses are shown on the waveform E. During the time period marked "X" the switch 11 is connected to the positive potential, as described above. Whenever the first data pulse arrives during this interval, the shift register 14 is advanced to its first or "one" count. This count then is detected by the AND gate 20 and supplied through the OR gate 21, as described previously, to enable the latch C1 of the command state register 18.

If, before any further data pulses appear on the waveform E, the switch 11 is moved to the center position, to once again permit clock pulses from the source 10 to pass through the inverter 29, the first negative-going signal transition causes a positive toggle pulse to be applied through the inverter 29 to all of the latches C1 through Cn of the command state latch circuit 18. Only the latch C1 is toggled or latched, however, since only the latch C1 has an enable input applied to it from the corresponding OR gate 21 through 27. This causes the output to appear on "Command State 1". As explained previously, this state is held by the now-constant enable signal supplied from the output of the latch C1 back through the OR gate 21 to its enable input.

Different command states may be selected simply by holding the clock input high (switch 11 connected to the source of positive potential shown in FIG. 1) for whatever desired number of data pulses correspond to the selected command state. As shown in waveforms F and G of FIG. 2, two data pulses are used to select "Command State 2". In the waveform set H and I, for clock and data inputs, respectively, the time "X" at which the clock signal is "held high" extends to a time sufficient to permit the number of data pulses to be supplied to advance the shift register 14 to the state corresponding to "Command State N". Once this has been accomplished, the switch 11 is moved to the central position, as shown in FIG. 1, to permit resumption of the clock pulses described above; so that the next clock pulse toggles the command state latch Cn to store that command state in the latch Cn where it remains until all of the command state latches C1 through Cn are reset or cleared.

It should be noted that when a command state is set by the next clock pulse after the switch 11 is returned from the "high" position to the central position to permit clock pulses from the source 10 to operate on the circuit, a reset clock pulse also is applied through the double inverter amplifiers 16 to the clear inputs of all of the stages of the shift register 14 to reset the register to its initial or zero state. This causes the register 14 to be ready to receive signals for establishing a new command, in the manner described above.

When resetting or clearing of all of the command state latches C1 through Cn is desired, the switch 11 shown in FIG. 1 is moved to its leftmost position connecting it to ground for a time period "Y". This causes the clock signal input to be held "low". When this occurs, the "low" signal is inverted by the inverting amplifier 36 to apply a high enabling signal to the enable input "D" of the input stage 32 of the two-stage binary "clear" circuit. This is indicated in waveform J of the lower set of four waveforms shown in FIG. 2. When the next data pulse on waveform K occurs during this time (Y), the positive going edge causes the stage 32 to be set. This then enables the second stage 34. When the negative-going edge of the data pulse occurs, it is inverted by the inverter 38 to transfer the information to the second stage 34, the output of which then is passed through the inverter 40 as a negative "clear" pulse to all of the clear inputs of the latch stages C1 through Cn of the command state latch circuit 18. This causes all of the latches to be set to their initial "low" or "zero" state, at which they remain until such time as the above noted sequence for latching information into them again takes place.

The output state of the clear circuit 30, shown on waveform L, remains low until the switch 11 is moved back to its central position to permit clock pulses from the source 10 once again to flow into the circuit. When this happens, the circuit 30, consisting of the bistable devices 32 and 34, is reset back to its original condition and remains reset throughout the duration of the operation of the normal clock and data pulses, as shown on waveforms J and K in FIG. 2.

From the foregoing it is readily apparent that any number of command states on different command state outputs can be selected by means of the signals on the clock and data lines 10 and 12. The switch 11 is indicated as a three-position manual switch; but clearly this switch may be an electronically operated switch located either on the integrated circuit chip, of which the circuit of FIG. 1 is a part, or on an external transmitting chip supplying the clock signals. Wherever the location of the switch 11 may be, the system requires signals on only two leads (or two integrated circuit pins) to effect operation of clock, data and any desired number of command states. The command states, as mentioned above, may be selected one at a time and then may be reset whenever the use for that particular command state signal is no longer needed. Alternatively, different command states may be selected in any combination, simply by resetting the shift register 14 without operating the latch clear circuit 30; so that it is possible to have any combination from one to all of the possible command states set at any given time for a system, if such a function is desired. Resetting of the previously set latches C1 to Cn for the different command states is effected simultaneously for all states by operation of the circuit 30 in the manner described above.

The foregoing description of the preferred embodiment of the invention is to be considered as illustrative, and not as limiting. Various changes and modifications for accomplishing the same result, using substantially the same structure in substantially the same way will occur to those skilled in the art, without departing from the true scope of the invention as defined in the appended claims.

I claim:

1. A serial bit input controller including in combination:

a source of binary clock pulses having an output and supplying pulses alternating between first and second signal levels and further including means therein for holding the signal on the output thereof at either of said first and second levels;

a source of binary data pulses having first and second signal levels;

a command storage register circuit having an enabling input coupled with the output of said source of binary clock pulses and having a toggle input coupled with said source of binary data pulses, said command storage register circuit enabled by the output of said source of binary clock pulses being held at said first level by said holding means;

a command latch circuit coupled with the output of said storage register circuit and coupled with said source of binary clock pulses for producing a command state signal corresponding to the output of said storage register circuit when the signal on the output of said source of binary clock pulses changes from the first level thereof to the second level thereof.

2. The combination according to claim 1 wherein said command latch circuit comprises a plurality of command state latches, each of which produces a different command signal.

3. The combination according to claim 1 wherein said command storage register circuit comprises a multistage shift register enabled by holding the output signal from said source of binary clock pulses at said first level and toggled in response to each binary data pulse applied thereto from said source of binary data pulses.

4. The combination according to claim 3 wherein said command latch circuit comprises a plurality of command state latches and a coincidence gate circuit having a predetermined number of outputs corresponding with the predetermined number of command states capable of being stored in said command storage register circuit, and the outputs of each stage of said shift register is applied to said coincidence gate circuit, with the outputs of said coincidence gate circuit each coupled with a different command state latch.

5. The combination according to claim 4 wherein said command state latches each have a clear input, and further including a clear logic circuit having an output coupled with the clear inputs of said command state latch circuits and having an enabling input coupled with the output of said source of binary clock pulses and enabled by the output signal from said source of binary clock pulses being held at said second level, said clear logic circuit further having a toggle input coupled with said source of binary data pulses to be toggled thereby with said source of binary clock pulses held at said second signal level to supply a clear pulse to the clear inputs of said command state latches.

6. The combination according to claim 5 wherein each of said command state latches have an enabling input coupled with a different output of said coincidence gate circuit and a toggle input coupled with the output of said source of binary clock pulses.

7. The combination according to claim 3 wherein said command latch circuit comprises a plurality of command state latches, each of which produces a different command signal.

* * * * *